73-632

12/28/82 XR 4,366,406 SR

United States Patent [19]

Smith et al.

[11] 4,366,406

[45] Dec. 28, 1982

[54] ULTRASONIC TRANSDUCER FOR SINGLE FREQUENCY APPLICATIONS

[75] Inventors: Lowell S. Smith, Schenectady, N.Y.; Axel F. Brisken, Shingle Springs, Calif.

[73] Assignee: General Electric Company, Schenectady, N.Y.

[21] Appl. No.: 249,286

[22] Filed: Mar. 30, 1981

[51] Int. Cl.[3] .......... H01L 41/08

[52] U.S. Cl. .......... 310/334; 310/336; 73/632

[58] Field of Search .......... 310/334–337, 310/322; 73/628, 632, 641, 642; 367/150, 152

[56] References Cited

U.S. PATENT DOCUMENTS

| | | | |
|---|---|---|---|
| 4,101,795 | 7/1978 | Fukumoto et al. | 310/336 |
| 4,211,948 | 7/1980 | Smith et al. | 310/332 |
| 4,211,949 | 7/1980 | Brisken et al. | 310/336 X |
| 4,217,516 | 8/1980 | Iinuma et al. | 310/335 |
| 4,217,684 | 8/1980 | Brisken et al. | 310/334 X |

*Primary Examiner*—Mark O. Budd
*Attorney, Agent, or Firm*—Donald R. Campbell; James C. Davis, Jr.; Marvin Snyder

[57] ABSTRACT

An ultrasonic transducer has two impedance matching layers bonded to the transducer element which have different thicknesses and are 90°–100° and 35°–55° matching layers. This structure has a high sensitivity comparable to a broadband front surface matched transducer with quarter wavelength (90° and 90°) matching layers, and has primarily a single resonant mode so as to be suitable for relatively narrow band applications.

6 Claims, 15 Drawing Figures

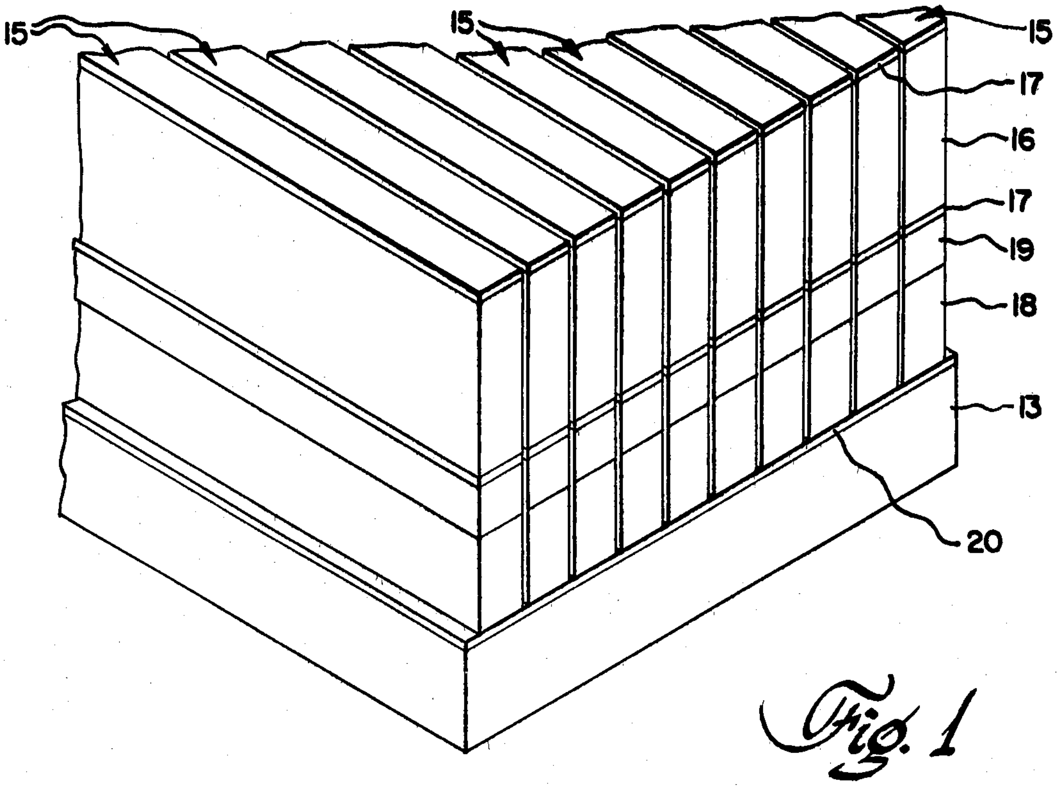
Fig. 1
Fig. 2
(PRIOR ART)
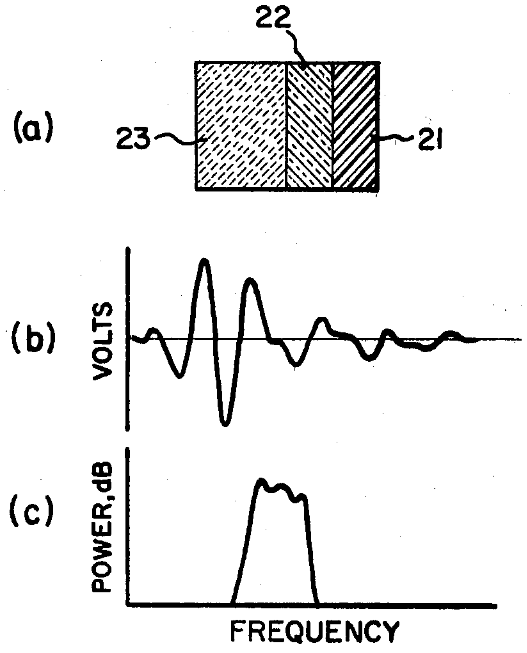
Fig. 3
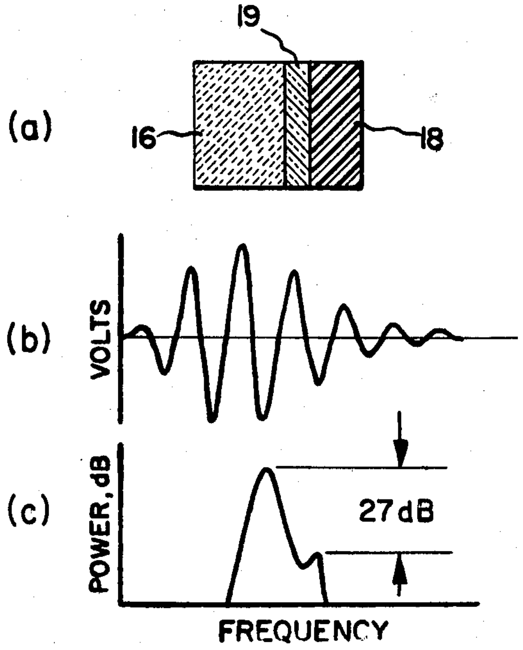

ULTRASONIC TRANSDUCER FOR SINGLE FREQUENCY APPLICATIONS

BACKGROUND OF THE INVENTION

This invention relates to ultrasonic transducers which achieve the combination of high sensitivity and small spectral range.

It is well known that impedance matching layers on the front surface of the transducer elements, which serve as acoustic impedance matching transformers, improve the overall sensitivity of ultrasonic transducers. Two quarter wavelength front surface matching layers lead to a broad bandwidth with a very short impulse response to a delta function excitation. If the impedance of the piezoelectric transducer material is $Z_T$ and the load has impedance $Z_L$, then for maximum sensitivity the two matching layers would have impedances $$Z_1 = \sqrt[3]{Z_T Z_L^2},\ Z_2 = \sqrt[3]{Z_T^2 Z_L}$$

and thicknesses $$t_1 = \frac{90^\circ}{360^\circ}\ \frac{Z_1}{P_1 f},\ t_2 = \frac{90^\circ}{360^\circ}\ \frac{Z_2}{P_2 f},$$

where $P_i$ is the density of the $i^{th}$ matching layer, and f is the nominal center frequency of operation. Double quarter wave matching leads to substantial improvement in sensitivity and widening of bandwidth over the unmatched transducer.

Front surface matched phased arrays with quarter wavelength glass and plastic impedance matching layers are described in the inventors' U.S. Pat. No. 4,211,948; the body contacting wear plate in U.S. Pat No. 4,211,949; and the fabrication of such an array having an epoxy backing in U.S. Pat. No. 4,217,684.

Some signal processing applications require an ultrasonic waveform of several cycles at a single frequency. These are ultrasound systems such as Doppler instruments where only a small spectral range is desired. The patented phased array transducers are wideband devices and do not meet this requirement.

SUMMARY OF THE INVENTION

The effective thicknesses of the two impedance matching layers is changed from quarter wave in order to retain the high sensitivity of the matching transformers while at the same time modifying the bandpass characteristics. Two matching layers of impedances $Z_1$ and $Z_2$ as given above are bonded to the front of the transducer element and match the high acoustic impedance of the element to the low acoustic impedance of the human body or water. The thickness of the first layer, the one next to the human body or water, is selected to be proportional to 90/360 to 100/360 wavelength and the thickness of the second layer, the one next to the element, is 35/360 to 55/360 wavelength. One illustrative transducer has 100° and 50° matching layers; the thicknesses then become:

$$t_1 = \frac{100^\circ}{360^\circ}\ \frac{Z_1}{P_1 f} \text{ and } t_2 = \frac{50^\circ}{360^\circ}\ \frac{Z_1}{P_2 f},$$

where $P_1$ and $P_2$ are the densities of the layers and f is the nominal reference frequency of operation.

There is only a small loss in signal compared to the double quarter wavelength matching layer device, however, the spectral width is drastically reduced. The preferred embodiment is a narrow bandwidth linear phased array transducer with a 100° acrylic resin plastic layer and a 50° borosilicate glass layer. The invention is applicable to other linear and annular arrays and to single-element transducers.

BRIEF DESCRIPTION OF THE DRAWINGS

FIG. 1 is a fragmentary perspective view of the front surface matched phased array transducer array and wear plate/lens;

FIGS. 2*a*–2*c* are, for a prior art transducer with two quarter wavelength impedance matching layers, a cross section through one element, a voltage waveform resulting from a single impulse excitation, and the frequency spectrum;

FIGS. 3*a*–3*c* are the same as the foregoing but for a transducer with 100° and 50° plastic and glass matching layers, respectively;

DESCRIPTION OF THE PREFERRED EMBODIMENTS

Figure 4:
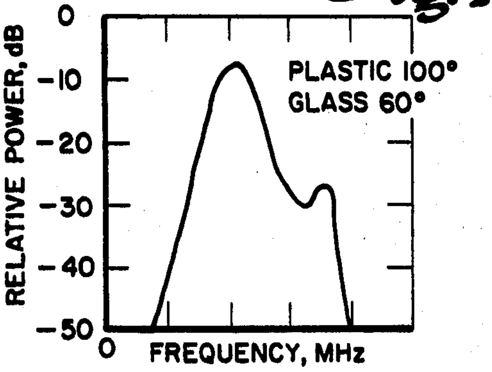
FIGS. 4–7 are frequency spectra for transducers having 100° plastic matching layers and 60°, 50°, 40°, and 30° glass layers.

The front surface matched phased array in FIG. 1 has a large field of view, a high sensitivity, and a relatively narrow band frequency spectrum, and uses narrow transducer elements which have a width on the order of one half wavelength at the ultrasound emission center frequency. The array is comprised of a large number of transducer element and impedance matching layer units 15 that are substantially isolated from one another and acoustically uncoupled. Every array unit includes a long, narrow piezoelectric ceramic transducer element 16 which has metallic coatings 17 on opposite faces to serve as electrodes and a thickness between metallic coatings on one half wavelength at the reference frequency since the element is a half wave resonator. Impedance matching layers 18 and 19 have different effective thicknesses and serve as acoustic matching transformers; the first layer 18 is a 100° matching layer and the second layer 19 is a 50° matching layer. Layer 18 is made of Plexiglas ® acrylic resin plastic or other plastic with the required value of acoustic impedance. Layer 19 is made of Pyrex ® borosilicate glass or other glass with the required acoustic impedance. Transformers 18 and 19 greatly improve energy transfer between the high impedance of the piezoelectric ceramic and the low impedance of the human body or water (the human body is largely water). The acoustic impedance of the PZT (lead zirconate titanate) piezoelectric ceramic is about $30\times10^5$ g/cm$^2$-sec and that of the human body and water is about $1.5\times10^5$ g/cm$^2$-sec, and for this transducer material the Pyrex layer has an acoustic impedance of $13.1\times10^5$ g/cm$^2$-sec and the Plexiglas layer is $3.2\times10^5$ g/cm$^2$-sec.

The lateral size of a transducer influences its mode of vibration. When the width and length are much greater than the thickness, the transducer element oscillates as a half wavelength, thickness mode resonator. Thus, the emission center frequency is determined directly from the element thickness ($f=Z/2\,\rho t$). We have called the frequency calculated from the element thickness, the reference frequency. Array elements are much narrower, with widths on the order of two-thirds the thickness. These narrow elements oscillate as two-dimensional cavity resonators and the emission center frequency is substantially reduced from the reference frequency. In this invention, all matching layer thicknesses are given in terms of reference frequency phase (emission center frequency phase for wide elements) where the piezoelectric ceramic is taken to be one-half wavelength thick, or 180° of phase. Quarter wavelength matching layers are thus represented by 90° of phase.

Pressure sensitive Mylar ® tape 20 is placed over the front surface of the array, and a relatively thick body contacting wear plate 13 adheres to the tape. The wear plate may have a curved external surface so that it also acts as a lens. The wear plate/lens is preferably filled silicone rubber (typically, General Electric Co. RTV-28); refraction, if it occurs, enhances the field of view and the wear plate/lens does not substantially change the transducer waveform. Not shown in this figure is a relatively large mass of an acoustic damping material such as epoxy which covers the backs of the elements 16. The addition of epoxy backing instead of an air backing substantially reduces the transducer element main shock excitation ring down noise. For water tank testing the wear plate/lens 13 may not be necessary.

FIG. 2*a* shows a cross section of a prior art broadband ultrasonic transducer having quarter wavelength plastic and glass impedance matching layers 21 and 22 on the front of a half wavelength ceramic element 23; such a transducer array with two quarter wavelength matching layers is described more fully in the inventor's U.S. Pat. No. 4,211,948 and the equations for the impedances and thicknesses of the two layers were given previously. It is conventional to draw layers 21 and 22 with the same thickness but in fact the actual thicknesses are not identical, as can be seen by looking at the equations for $t_1$ and $t_2$, because the velocity of sound in the plastic and glass materials is not the same (Z/P is equal to velocity). The ideal impedances for a two-layer system with PZT ceramic are $4.1\times10^5$ g/cm$^2$-sec and $11.1\times10^5$ g/cm$^2$-sec. The impedances of Plexiglas and Pyrex mentioned above represent a close approximation with readily available materials. FIG. 2*b* depicts the impulse response resulting from a "delta function" excitation. It is seen in FIG. 2*c* that the transducer has a broadband frequency spectrum.

There are two ways to modify the matching layer structure in order to obtain different device characteristics. First, one may change the impedance of the matching layers. This leads to a materials problem, however, because a suitable material with the calculated acoustic impedance may not be readily found and may have to be made specially. Second, one may change the effective thickness of the layers. Analyses of these possibilities by one dimensional models of transducer impulse response and frequency spectrum resulted in choosing the second approach.

This invention involves the use of two matching layers of acoustic impedance $Z_1$ and $Z_2$ as given above for a pair of quarter wavelength layers. However, the thickness of these layers has been selected as $$t_1 = \frac{100^\circ}{360^\circ}\,\frac{Z_1}{P_1 f} \text{ and } t_2 = \frac{50^\circ}{360^\circ}\,\frac{Z_2}{P_2 f},$$

where $P_1$ and $P_2$ are the densities of the layers and f is the nominal reference frequency of operation. The device structure with 100° and 50° matching layers is illustrated in FIG. 3*a*. In FIG. 3*b*, the impulse response resulting from the same excitation pulse as in FIG. 2*b* exhibits greater uniformity of frequency. It is seen in FIG. 3*c* that the transducer has a relatively narrow bandwidth frequency spectrum. The higher frequency secondary peak is 27 dB down from the primary peak. This architecture achieves high sensitivity and a primarily single resonant mode. The sensitivity of the resulting structure is comparable to that of the quarter wavelength matching device. There is less than 1.5 dB loss in signal, however, the spectral width is drastically reduced.

Figure 5:
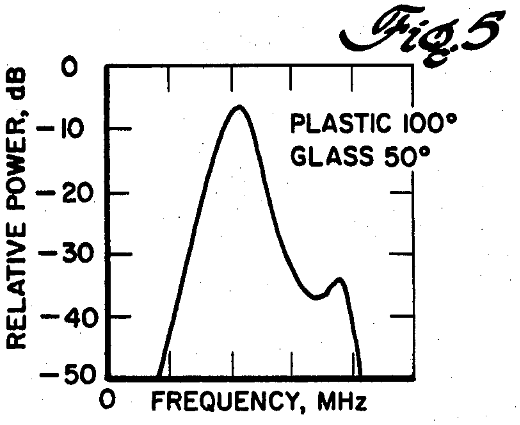
Figure 6:
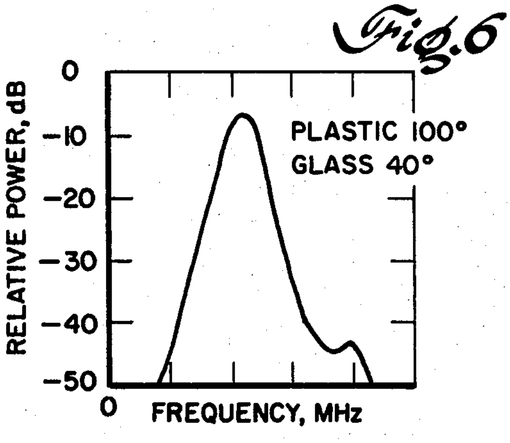
Figure 7:
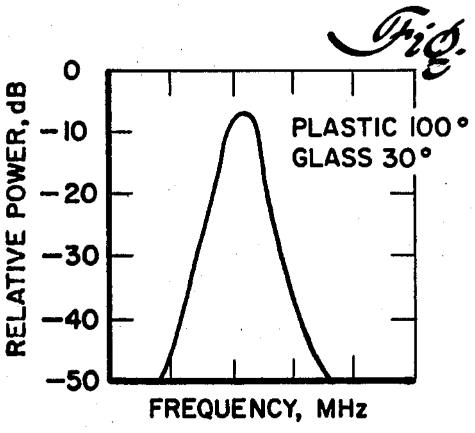
Figure 8:
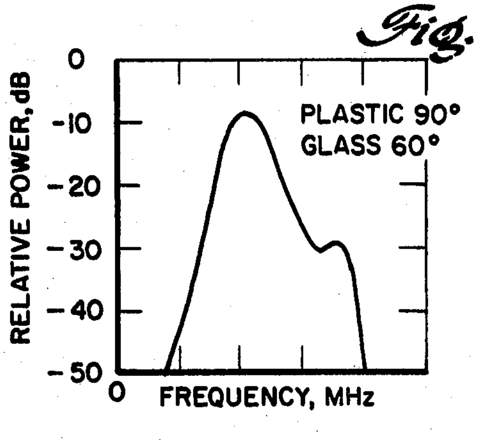
FIGS. 8–11 are frequency spectra for transducers having 90° plastic matching layers and 60°, 50°, 40°, 30° glass layers.
Figure 9:
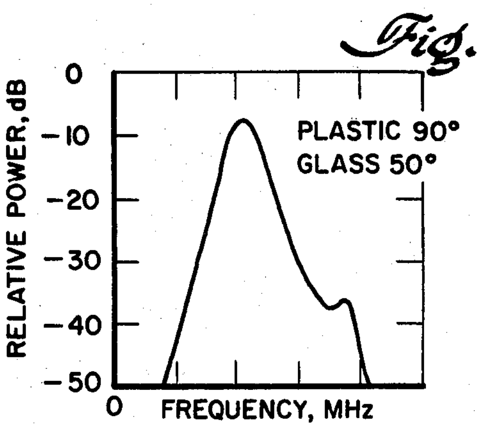
Figure 10:
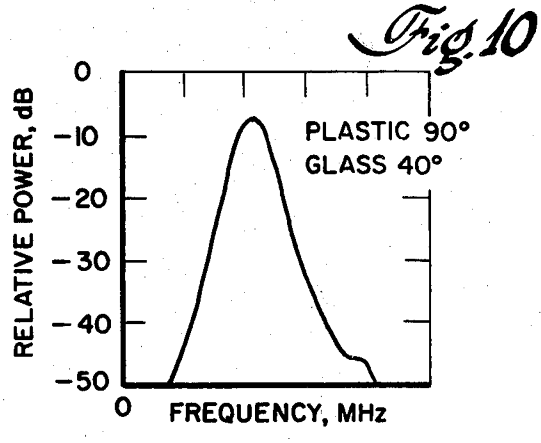
Figure 11:
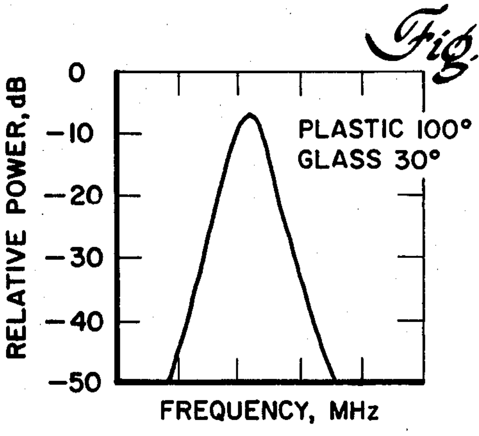

Assuming that the thickness of the first matching layer (plastic in the specific example) is proportional to 100/360 wavelength, the thickness of the second matching layer (glass in the example) is proportional to 35/360 to 55/360 wavelength. FIGS. 4–7 are frequency spectra computed for a 100° plastic layer in combination with different thicknesses of glass. The 100° plastic and 60° glass layers are not satisfactory because of the prominent secondary peak; this transducer does not have a primarily single resonant mode but rather has two modes of ossillation, as do thicker glasses up to 90°. FIG. 5 for 100° plastic and 50° glass layers is identical to FIG. 3*c*. The 100° plastic and 40° glass layer structure has a negligible high frequency secondary peak and is acceptable. The frequency spectrum for 100° plastic and 30° glass layers is single-peaked but at this point the glass becomes too thin for fabrication yield. A full set of charts for glass thicknesses from 90° to 10° shows that the thinner the glass, the more coherent or higher Q the transducer becomes. The 35° to 55° layers are selected as being the optimum and at these thicknesses there is little reduction (less than 1.5 dB) in pulse amplitude.

High sensitivity, narrow bandwidth ultrasonic transducers are also constructed in which the first matching layer thickness is held at one quarter wavelength (90°) and the second matching layer thickness is proportional to 35/360 to 55/360 wavelength. The frequency spectra in FIGS. 8–11 are to the same scale as FIGS. 4–7 and are computed for a 90° plastic layer in combination with 60° glass to 30° glass layers. The same components apply to the pairs of frequency spectra, i.e., FIGS. 4 and 8, FIGS. 5 and 9, etc. In both cases, the spectra are computed for a transducer structure which radiates ultrasound into the human body and has an epoxy backing, a PZT ceramic element, and Plexiglas and Pyrex matching layers. The ultrasound emission center frequency is typically 2 MHz to 5 MHz.

These narrow bandwidth transducers have utility in signal processing applications that require a relatively coherent ultrasonic excitation. Doppler signal processing is one of these, and another is tisssue characterization. Some phased array ultrasound imagers may perform better with the narrow bandwidth transducer. There are many other configurations of such a transducer including linear arrays, annular arrays, and single element devices.

While the invention has been particularly shown and described with reference to preferred embodiments thereof, it will be understood by those skilled in the art that various changes in form and details may be made therein without departing from the spirit and scope of the invention.

The invention claimed is:

1. An ultrasonic transducer for single frequency applications comprising:

a front surface matched transducer comprising at least one transducer element to which are bonded first and second impedance matching layers that serve as acoustic transformers to match the high acoustic impedance of said element to the low acoustic impedance of the human body or water;

said first matching layer having a thickness proportional to 90/360 to 100/360 wavelength and said second matching layer next to said element having a thickness proportional to 35/360 to 55/360 wavelength, both at a given nominal reference frequency of operation;

said front surface matched transducer having a narrow band frequency spectrum and high sensitivity.

2. The ultrasonic transducer of claim 1 wherein said first and second matching layers are respectively 100/360 wavelength and 50/360 wavelength matching layers.

3. The ultrasonic transducer of claim 2 wherein said transducer element is piezoelectric ceramic and said first and second matching layers are plastic and glass, respectively.

4. The ultrasonic transducer of claim 1 wherein said front surface matched transducer is an array comprised of a plurality of said transducer elements to each of which are bonded said first and second matching layers having the given different thicknesses.

5. An ultrasonic transducer for single frequency applications comprising:

a front surface matched linear transducer array comprising plural transducer elements which are acoustically uncoupled and to each of which are bonded first and second impedance matching layers that serve as acoustic transformers to match the high acoustic impedance of said elements to the low acoustic impedance of the human body or water;

said first matching layer having a thickness $$t_1 = \frac{100°}{360°} \frac{Z_1}{P_1 f}$$

and said second matching layer having a thickness $$t_2 = \frac{50°}{360°} \frac{Z_2}{P_2 f},$$

where $Z_1$ and $Z_2$ are the acoustic impedances of said first and second layers, $P_1$ and $P_2$ are the densities of said first and second layers, and f is the nominal reference frequency of operation;

said front surface matched array having a narrow band frequency spectrum and high sensitivity.

6. The ultrasonic transducer of claim 5 wherein said transducer elements are piezoelectric ceramic and said first and second matching layers are acrylic resin plastic and borosilicate glass.

* * * * *